(12) United States Patent
Wang et al.

(10) Patent No.: US 11,723,169 B2
(45) Date of Patent: Aug. 8, 2023

(54) ELECTRONIC APPARATUS

(71) Applicant: Lenovo (Beijing) Limited, Beijing (CN)

(72) Inventors: Cuicui Wang, Beijing (CN); Ying Sun, Beijing (CN)

(73) Assignee: LENOVO (BEIJING) LIMITED, Beijing (CN)

( * ) Notice: Subject to any disclaimer, the term of this patent is extended or adjusted under 35 U.S.C. 154(b) by 0 days.

(21) Appl. No.: 17/550,287

(22) Filed: Dec. 14, 2021

(65) Prior Publication Data

US 2022/0312634 A1    Sep. 29, 2022

(30) Foreign Application Priority Data

Mar. 25, 2021    (CN) .......................... 202110319872.4

(51) Int. Cl.
*H05K 7/20*    (2006.01)

(52) U.S. Cl.
CPC ..... *H05K 7/20154* (2013.01); *H05K 7/20172* (2013.01); *H05K 7/20409* (2013.01)

(58) Field of Classification Search
CPC . G06F 1/20; G06F 1/181; G06F 1/182; G06F 1/184; G06F 1/185; G06F 1/188; G06F 1/187; G06F 1/189; G06F 1/203; G06F 1/186; G06F 1/1684; G06F 1/1658; G06F 1/1613; G06F 1/206; H05K 7/20172; H05K 5/03; H05K 1/0203; H05K 7/20154; H05K 7/20209;
(Continued)

(56) References Cited

U.S. PATENT DOCUMENTS 3,434,014 A * 3/1969 Taynton ............. H05K 7/20009
3,596,139 A * 7/1971 Walsh .................... H05K 5/061
361/796

(Continued)

FOREIGN PATENT DOCUMENTS

CN    207783398 U    8/2018
CN    110399022 A    11/2019
CN    209690864 U    11/2019

OTHER PUBLICATIONS

Yang, Xin, The client terminal equipment. May 8, 2020, CN-111132507-A, PE2E English translation (Year: 2020).*

(Continued)

*Primary Examiner* — Michael A Matey
(74) *Attorney, Agent, or Firm* — Anova Law Group, PLLC

(57) ABSTRACT

An electronic apparatus includes a cylindrical housing, a first functional member, a second functional member, and a heat dissipation assembly. The cylindrical housing includes an air inlet structure and an air outlet structure. The first functional member and the second functional member are arranged in the cylindrical housing. The first functional member and the second functional member are alternately arranged. The heat dissipation assembly is arranged in the cylindrical housing. The first functional member and the second functional member are thermally connected to two heat transfer contact surfaces of the heat dissipation assembly, respectively. The heat dissipation assembly is configured to perform heat dissipation processing on the first functional member and the second functional member.

9 Claims, 6 Drawing Sheets

(58) Field of Classification Search
CPC .. H05K 7/2039; H05K 7/20409; H05K 1/181; H05K 5/02; H05K 1/184; H05K 5/0213; H05K 5/0217; H05K 7/209; H05K 7/20254; H05K 7/1429; H05K 7/1431; H04R 1/02; G11B 25/02; H04B 1/036
See application file for complete search history.

(56) References Cited

U.S. PATENT DOCUMENTS

| | | | | |
|---|---|---|---|---|
| 4,810,917 A * | 3/1989 | Kumar | | H02K 11/33 29/841 |
| 5,621,617 A * | 4/1997 | Goss | | H05K 7/1434 361/721 |
| 5,889,651 A * | 3/1999 | Sasaki | | H01L 23/467 361/699 |
| 6,501,653 B1 * | 12/2002 | Landsgestell | | H02M 7/003 174/15.1 |
| 6,778,389 B1 * | 8/2004 | Glovatsky | | H01L 25/065 361/720 |
| 7,180,736 B2 * | 2/2007 | Glovatsky | | H05K 7/1434 361/688 |
| 8,004,844 B2 * | 8/2011 | Kim | | H05K 7/20409 361/728 |
| 10,212,816 B2 * | 2/2019 | Rieke | | H05K 7/20863 |
| 10,264,703 B2 * | 4/2019 | Chen | | H04B 1/036 |
| 10,292,296 B1 * | 5/2019 | Wurmfeld | | H05K 7/1409 |
| 11,116,108 B2 * | 9/2021 | Kim | | G06F 1/1632 |
| 2004/0196999 A1 * | 10/2004 | Han | | H04R 1/2819 381/345 |
| 2010/0002383 A1 * | 1/2010 | Yeh | | G06F 1/183 361/695 |
| 2014/0362522 A1 * | 12/2014 | Degner | | G06F 1/181 361/679.54 |
| 2015/0345282 A1 * | 12/2015 | Logan | | E21B 47/01 166/243 |
| 2016/0302320 A1 * | 10/2016 | Kim | | G06F 1/1698 |
| 2018/0051918 A1 * | 2/2018 | VanTubergen, Jr. | | F25B 27/002 |
| 2020/0186763 A1 * | 6/2020 | Chen | | G03B 21/16 |
| 2022/0248566 A1 * | 8/2022 | Chen | | H05K 7/20263 |

OTHER PUBLICATIONS

Jie, Jun-ren, Electronic device, Oct. 27, 2020, CN-111836493-A, PE2E English translation (Year: 2020).*

Li, Yan-Ping, A radiating structure and intelligent electronic device, Aug. 28, 2018, CN-207783398-U, PE2E English translation (Year: 2018).*

* cited by examiner

ELECTRONIC APPARATUS

CROSS-REFERENCE TO RELATED APPLICATION

This application claims priority to Chinese Patent Application No. 202110319872.4, filed on Mar. 25, 2021, the entire content of which is incorporated herein by reference.

TECHNICAL FIELD

Functional members inside an electronic apparatus generate heat during operation. Often a heat dissipation device is arranged in the electronic apparatus to perform heat dissipation processing. According to layout features of the functional members in the existing electronic apparatus, a plurality of heat dissipation devices are needed to perform the heat dissipation on the functional members, respectively. Thus, the layout structure of the electronic apparatus is complex, and the volume of the electronic apparatus is relatively large.

BACKGROUND

Each functional component inside the electronic apparatus generates heat during operation, and a radiator is usually provided for heat dissipation. Due to the layout characteristics of the functional components in the existing electronic equipment, multiple heat sinks are required to dissipate the heat of the functional components, respectively, resulting in a complex layout structure and a large volume of the electronic equipment.

SUMMARY

Embodiments of the present disclosure provide an electronic apparatus, including a cylindrical housing, a first functional member, a second functional member, and a heat dissipation assembly. The cylindrical housing includes an air inlet structure and an air outlet structure. The first functional member and the second functional member are arranged in the cylindrical housing. The first functional member and the second functional member are alternately arranged. The heat dissipation assembly is arranged in the cylindrical housing. The first functional member and the second functional member are thermally connected to two heat transfer contact surfaces of the heat dissipation assembly, respectively. The heat dissipation assembly is configured to perform heat dissipation processing on the first functional member and the second functional member.

The electronic apparatus includes the cylindrical case. The first functional member and the second functional member are alternately arranged in the cylindrical housing. Thus, both the first functional member and the second functional member are thermally connected to the two heat transfer contact surfaces of the heat dissipation assembly. The heat generated by the first functional member and the second functional member during operation is transferred to the heat dissipation assembly. The electronic apparatus realizes the heat dissipation of the first functional member and the second functional member through one heat dissipation assembly in the cylindrical housing with limited space. Therefore, the layout is compact, and the size is reduced.

Other aspects of the present disclosure can be understood by those skilled in the art in light of the description, the claims, and the drawings of the present disclosure.

BRIEF DESCRIPTION OF THE DRAWINGS

The following drawings are merely examples for illustrative purposes according to various disclosed embodiments and are not intended to limit the scope of the present disclosure.

REFERENCE NUMERALS

Figure 1:
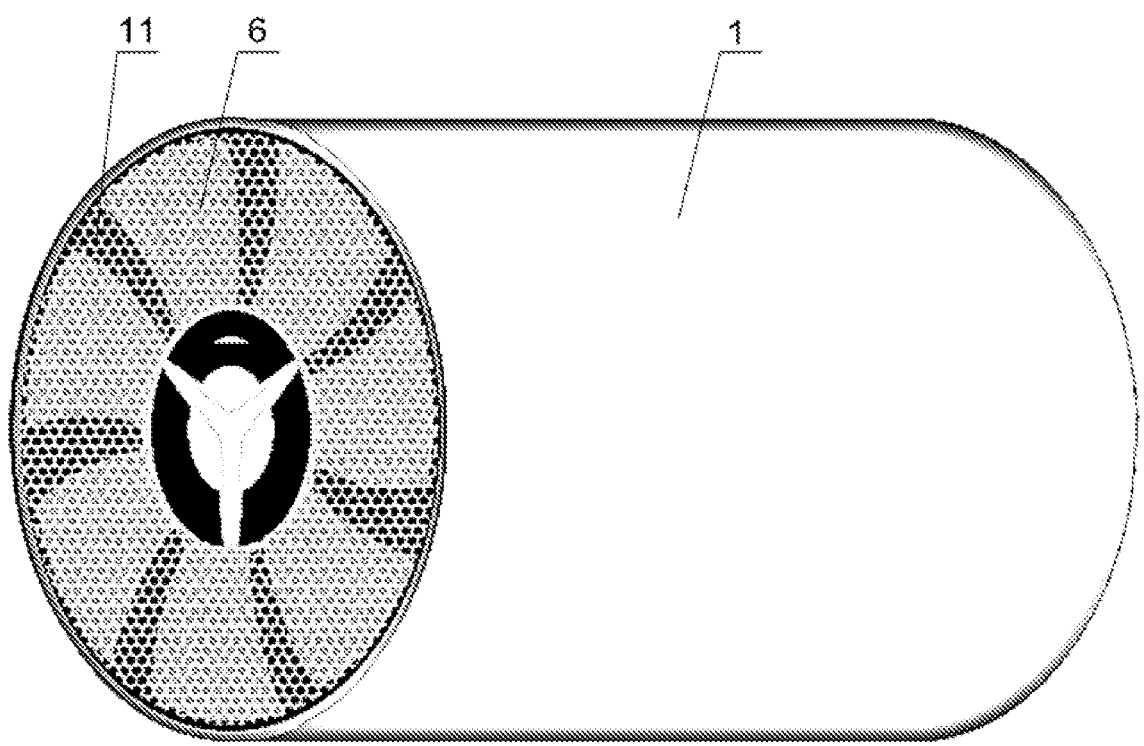
FIG. 1 illustrates a schematic structural diagram showing an appearance of an electronic apparatus according to some embodiments of the present disclosure.

1—Cylindrical housing, 11—Air inlet structure, 12—Air outlet structure, 13—First area, 14—Second area, 2—Heat dissipation assembly, 21—Heat sink set, 22—Heat pipe set, 221—Motherboard heat pipe set, 222—Shared heat pipe set, 223—Graphic card heat pipe set, 3—First functional member, 31—Motherboard, 32—Central processing unit (CPU), 4—Second functional member, 41—Graphic card, 42—Graphic processing unit (GPU), 5—Power module, 6—Fan.

DETAILED DESCRIPTION OF THE EMBODIMENTS

The present disclosure provides an electronic apparatus, which meets the heat dissipation requirements while making the structural layout compact and reducing the volume.

The technical solutions of embodiments of the present disclosure are described in detail in conjunction with the accompanying drawings of embodiments of the present disclosure. Apparently, described embodiments are only some embodiments of the present disclosure rather than all embodiments. Based on embodiments of the present disclosure, all other embodiments obtained by those of ordinary skill in the art without creative efforts should be within the scope of the present disclosure.

With reference to FIGS. 1 to 6, embodiments of the present disclosure provide an electronic apparatus, including a cylindrical housing 1, a first functional member 3, a second functional member 4, and a heat dissipation assembly 2. The cylindrical housing 1 includes an air inlet structure 11 and an air outlet structure 12. The first functional member 3 and the second functional member 4 are both arranged in the cylindrical housing 1. The first functional member 3 and the second functional member 4 are arranged alternately. The heat dissipation assembly 2 is arranged in the cylindrical housing 1. The first functional member 3 and the second functional member 4 are thermally connected to two heat transfer contact surfaces of the heat dissipation assembly 2, respectively. The heat dissipation assembly 2 may be configured to perform heat dissipation processing on the first functional member 3 and the second functional member 4.

The electronic apparatus includes the cylindrical case 1. Air may enter through the air inlet structure 11 and exit through the air outlet structure 12. The first functional member 3 and the second functional member 4 are alternately arranged in the cylindrical housing 1 with limited space. Thus, both the first functional member 3 and the second functional member 4 are thermally connected to the two heat transfer contact surfaces of the heat dissipation assembly 2. Heat generated by both of the first functional member 3 and the second functional member 4 during operation may be transferred to one heat dissipation assembly 2. In electronic apparatus, the one heat dissipation assembly 2 may realize heat dissipation of the first functional member 3 and the second functional member 4 in the cylindrical housing 1 with the limited space. The layout may be compact, and the volume may be reduced.

Further, in embodiments of the present disclosure, the cylindrical housing 1 may have a cylindrical structure, an elliptical cylindrical structure, or a polygonal cylindrical structure. The first functional member 3 and the second functional member 4 may have different shape parameters. The first functional member 3 and the second functional member 4 may be parallel to an axial direction of the cylindrical housing 1. Since the cylindrical housing 1 may have a sufficient axial space, the first functional member 3 and the second functional member 4 may be suitable to be arranged parallel to the axial direction of the cylindrical housing 1. Thus, the axial space may be used to satisfy a relatively large size design of the first functional member 3 and the second functional member 4 to meet functional design requirements.

For example, the first functional member 3 may include a motherboard 31 and a central processing unit (CPU) 32. The CPU 32 may be arranged at the motherboard 31. The motherboard 31 may be arranged parallel to the axial direction of the cylindrical housing 1 and be a long strip-shaped motherboard. The CPU 32 may be thermally connected to a heat transfer contact surface of the heat dissipation assembly 2. The second functional member 4 may include a graphic card 41 and a graphic processing unit (GPU) 42. The GPU 42 may be arranged on the graphic card 41. The graphic card 41 may be parallel to the axial direction of the cylindrical housing 1. The graphic card 41 and the motherboard 31 may be alternately arranged. The graphic card 41 and the motherboard 31 may be connected through an external wire. The graphic card 41 and the motherboard 31 may be arranged around the heat dissipation assembly 2. The GPU 42 may be thermally connected to another heat transfer contact surface of the heat dissipation assembly 2. During operation, the heat generated by the CPU 32 and the GPU 42 may be transferred to the same heat dissipation assembly 2. Thus, the heat dissipation of the motherboard 31 and the graphic card 41 may be performed by one heat dissipation assembly 2. The motherboard 31 and the graphic card 41 may be alternately arranged in the cylindrical housing 1. Therefore, the layout may be compact, and the volume may be reduced.

Further, in embodiments of the present disclosure, the first functional member 3 may divide the inside of the cylindrical housing 1 into a first area 13 and a second area 14. The heat dissipation assembly 2 and the second functional member 3 may be both located in the first area 13. The first functional member 3 may be parallel to the axial direction of the cylindrical housing 1. To increase a width dimension of the first functional member 3, which is perpendicular to the axial direction of the cylindrical housing 1, two side edges of the first functional member 3 parallel to the axial direction may be arranged as close to an inner wall of the cylindrical housing 1 as possible. Thus, the first functional member 3 may divide the cylindrical housing 1 into the first area 13 and the second area 14. The heat dissipation assembly 2 may be located in the first area 13. To cause the heat dissipation assembly 2 to perform the heat dissipation on both the first functional member 3 and the second functional member 4, the second functional member 4 may also be arranged in the first area 13.

In some embodiments, a space of the first area 13 may be larger than a space of the second area 14. Thus, the first area 13 may accommodate a larger heat dissipation assembly 2 to improve the heat dissipation performance of the heat dissipation assembly 2.

Further, in embodiments of the present disclosure, the first functional member 3 and the second functional member 4 may be arranged perpendicular to each other. The two heat transfer contact surfaces of the heat dissipation assembly 2 may be perpendicular to each other. With such an arrangement, the heat dissipation assembly 2 may be ensured to have a relatively large volume. The width dimension of the second functional member 4, which is in the direction perpendicular to the first functional member 3, may be increased as large as possible. Thus, a thickness dimension of the second functional member 4 may be increased, thereby satisfying function design requirements of the second functional member 4. For example, if the graphic card 41 is perpendicular to the motherboard 31, the width dimension of the graphic card 41 may be increased as large as possible, which may provide more space for an extension member of the graphic card 41, that is, the size in the thickness direction.

In embodiments of the present disclosure, the heat dissipation assembly 2 may include a heat sink set 21 and a plurality of heat pipe sets 22. The heat sink set 21 may include a plurality of heat sink fins stacked together, which can increase a heat dissipation area. An outside contour shape of the heat sink set 21 may adapt to an inner shape of the cylindrical housing 1. Thus, a number and a volume of the heat sink fins of the heat sink set 21 may be increased as large as possible to improve the heat dissipation performance. A plurality of heat pipe sets 22 may be arranged through the heat sink set 21. The first functional member 3 may correspondingly contact at least one heat pipe set 22 to transfer heat. The second functional member 4 may correspondingly contact at least one heat pipe set 22 to transfer heat. The heat of the first functional member 3 and the second functional member 4 may be transferred to the heat sink set 21 through a corresponding heat pipe set 22.

During operation, the heat of the first functional member 3 may be transferred to the at least one heat pipe set 22 first, and then the heat pipe set 22 may transfer the heat to the heat sink set 21. The heat of the second functional member 4 may be transferred to the at least one heat pipe set 22 first, and then the heat pipe group 22 may transfer the heat to the heat sink set 21. The heat may be dissipated through the heat sink set 21. The air entering into the cylindrical housing 1 may be used to discharge the heat.

Figure 2:
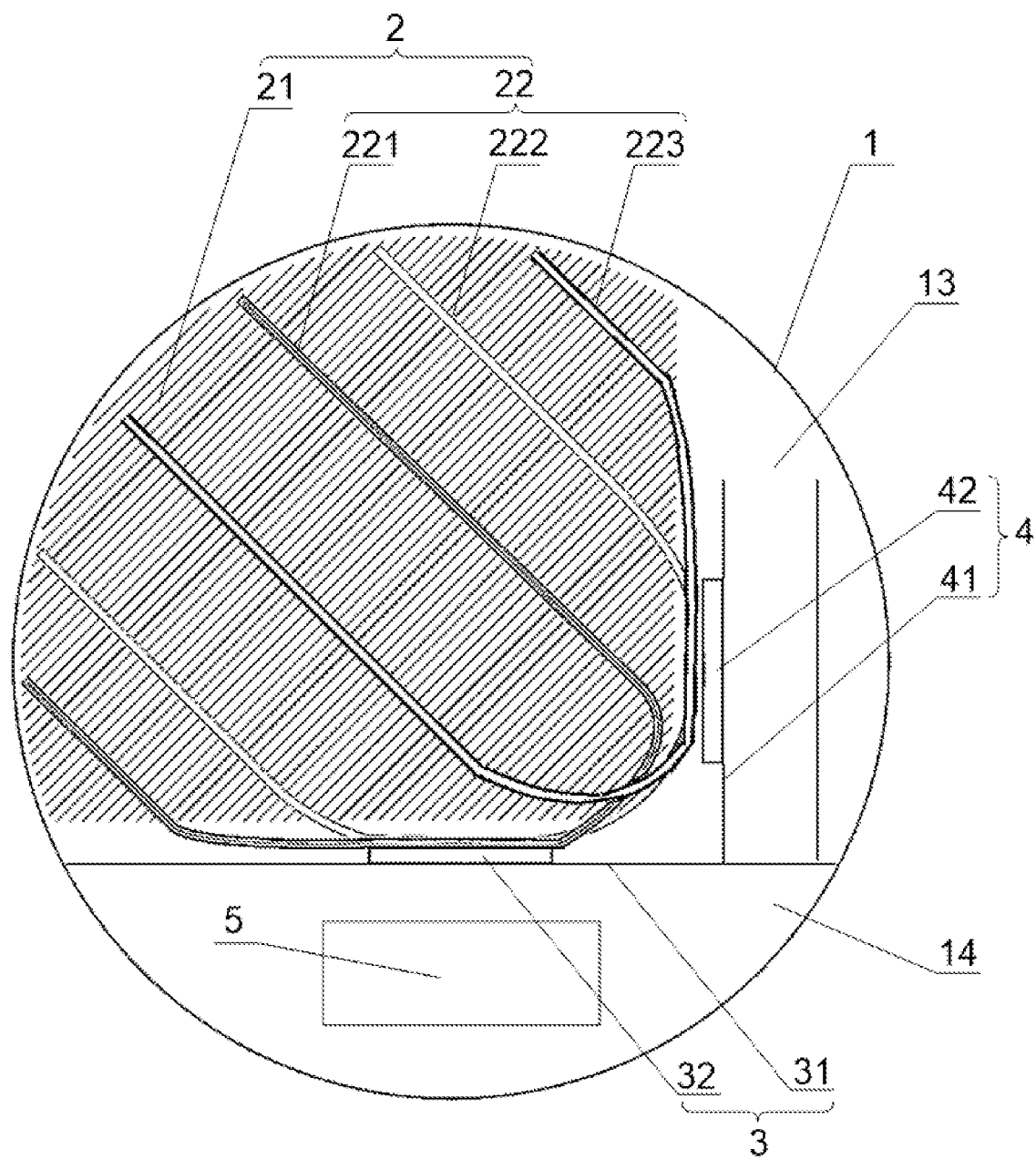
FIG. 2 illustrates a schematic structural diagram showing an internal layout of an electronic apparatus according to some embodiments of the present disclosure.
Figure 3:
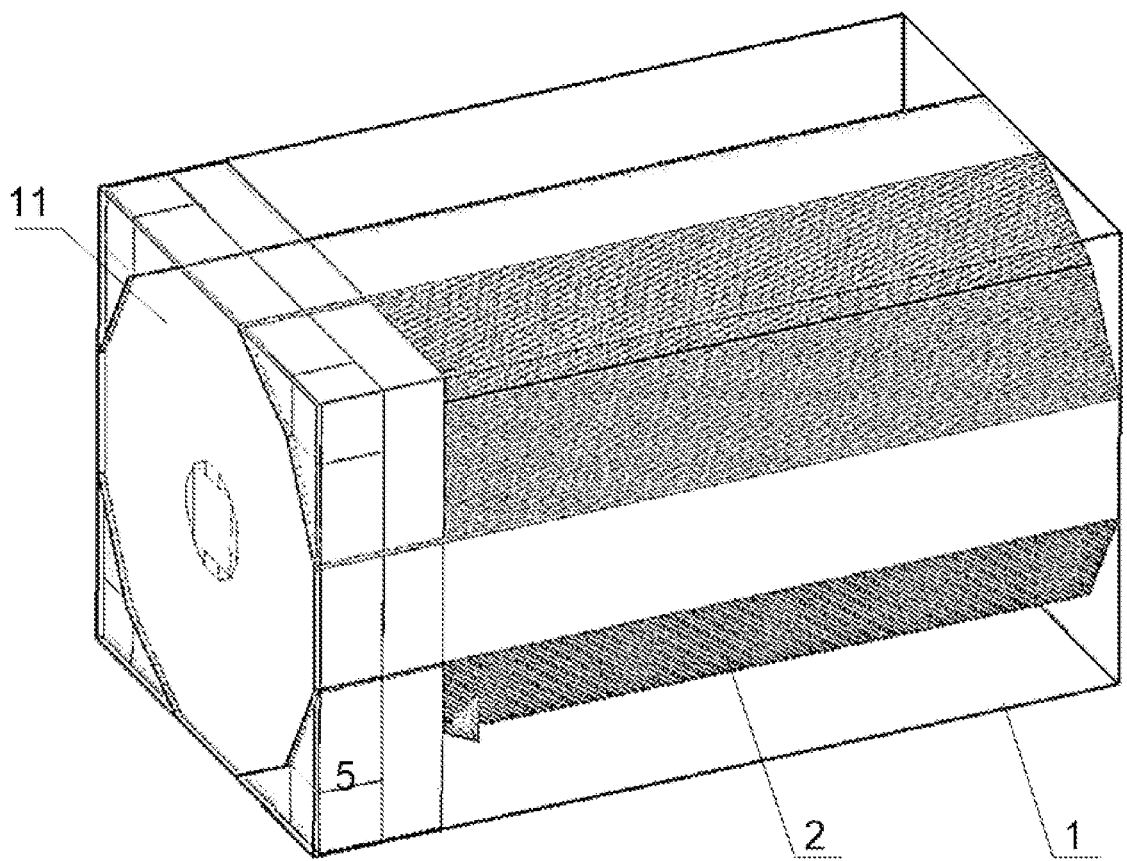
FIG. 3 illustrates a schematic front view of an electronic apparatus according to some embodiments of the present disclosure.
Figure 4:
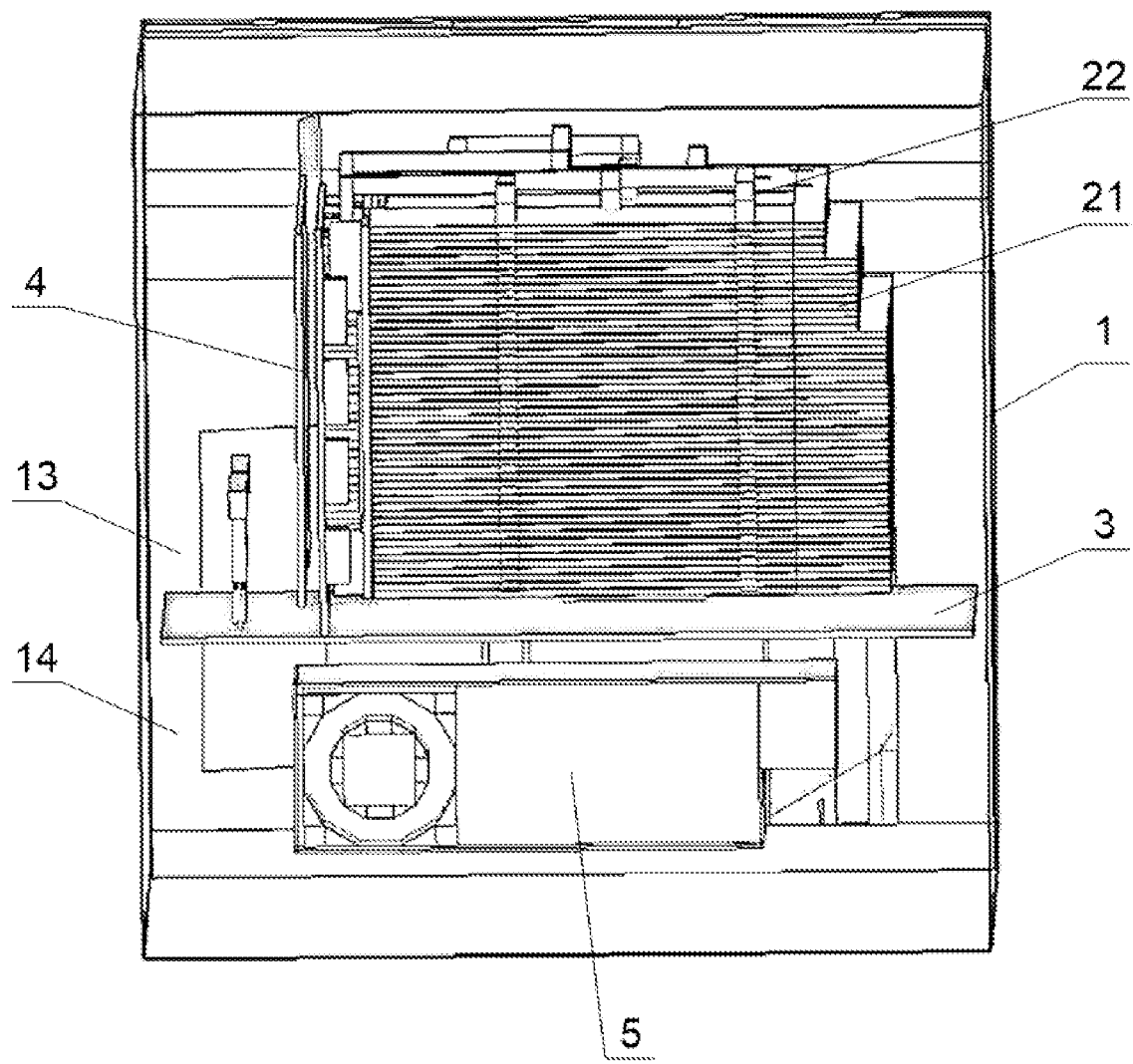
FIG. 4 illustrates a schematic rear view of an electronic apparatus according to some embodiments of the present disclosure.
Figure 5:
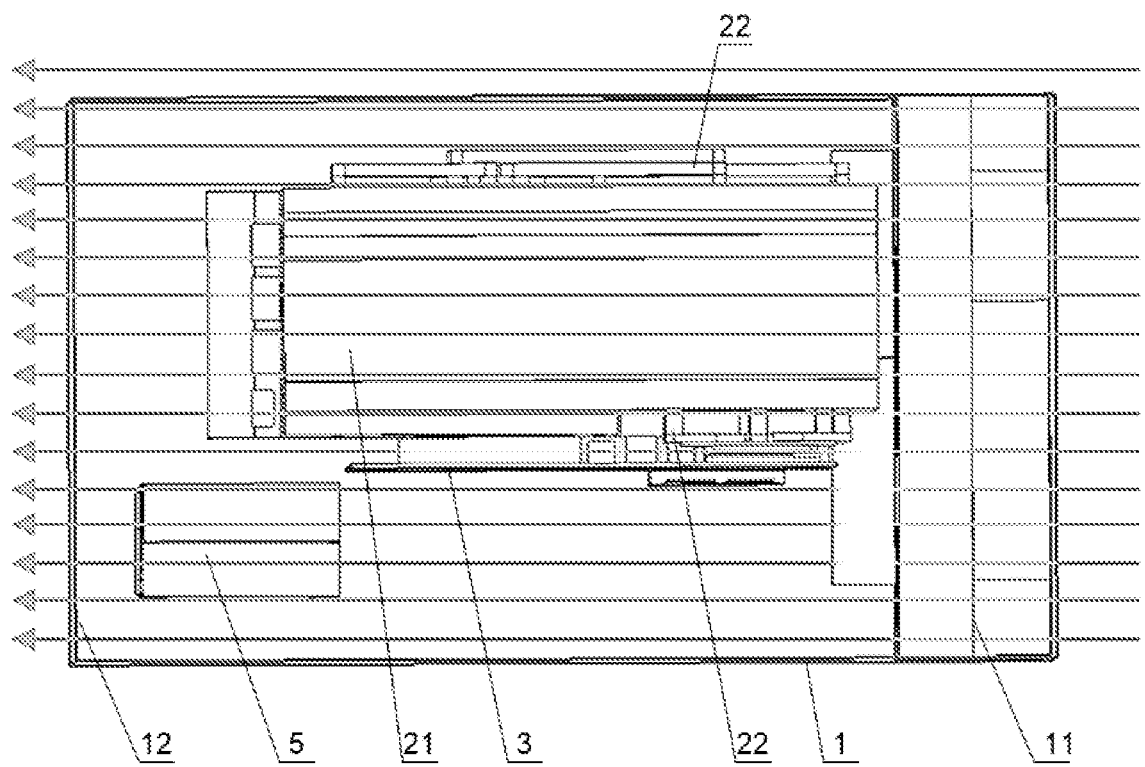
FIG. 5 illustrates a schematic side view of an electronic apparatus according to some embodiments of the present disclosure.
Figure 6:
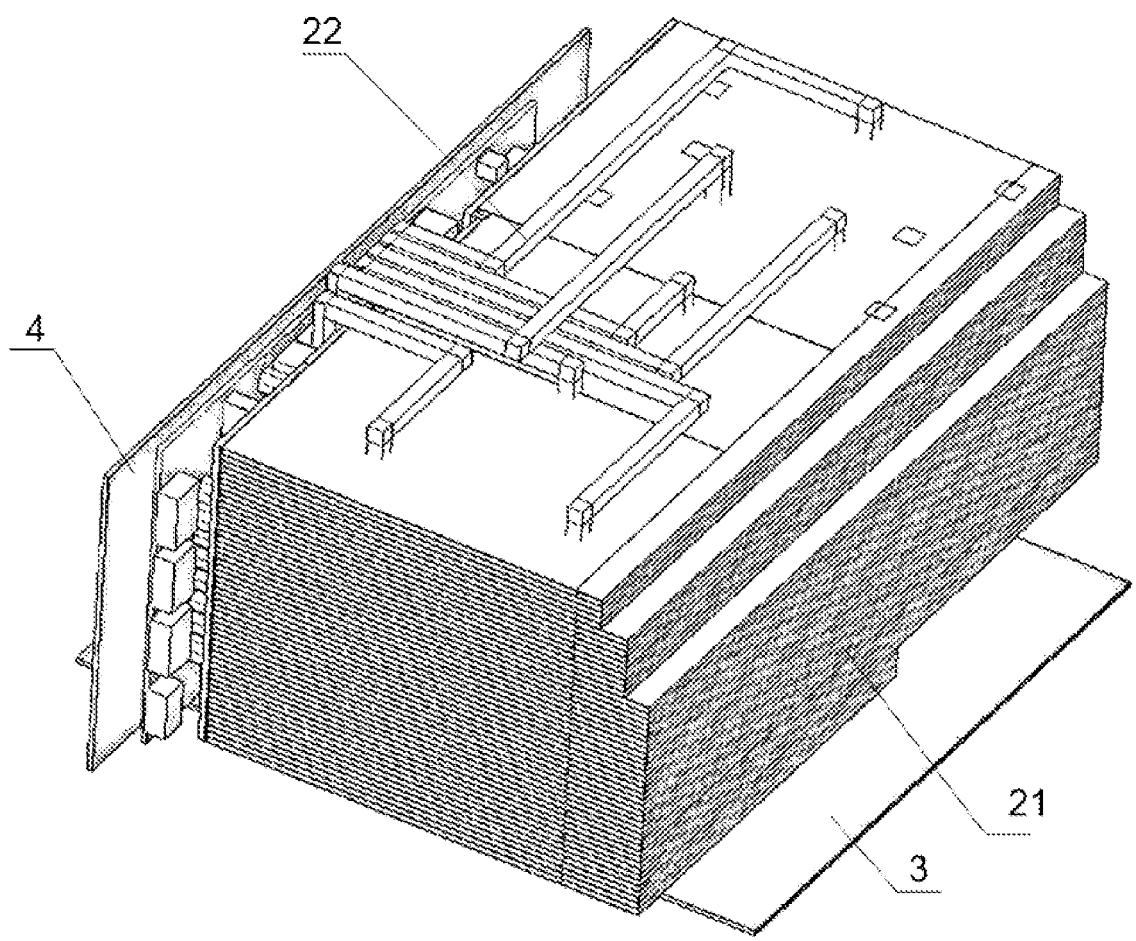
FIG. 6 illustrates a schematic inner structural diagram of an electronic apparatus according to some embodiments of the present disclosure.

Further, as shown in FIG. 2, the at least one heat pipe set 22 is in thermal contact with both of the first functional member 3 and the second functional member 4. Thus, the heat pipe set 22 may perform the heat dissipation on the first functional member 3 and the second functional member 4. That is, the heat pipe set 22 includes three types. A first type of heat pipe set may be configured to independently perform heat transfer on the first functional member 3. A second type of heat pipe set may be configured to independently perform heat transfer on the second functional member 4. A third type of heat pipe set may be configured to be capable of performing heat transfer on both of the first functional member 3 and the second functional member 4.

With such an arrangement, when the first functional member 3 is a main working member, the heat may be mainly generated by the first functional member 3. Therefore, the first type of heat pipe set may be individually configured to transfer the heat of the first function member 3, and the third type of heat pipe set may also be configured to transfer the heat of the first function member 3. As such, a utilization rate of the heat dissipation area of the heat sink set 21 to the first functional member 3 may be increased to accelerate a heat dissipation speed of the first functional member 3. When the second functional member 4 is the main working member, the heat may be mainly generated by the second functional member 4. Therefore, the second type of heat pipe set may be individually configured to transfer the heat of the second functional member 4, and at the same time, the third type of heat pipe set may also be configured to transfer the heat of the second functional member 4. As such, a utilization rate of the heat dissipation area of the heat sink set 21 to the second functional member 4 may be increased to accelerate a heat dissipation speed of the second functional member 4. The third type of heat pipe set may be shared by the first functional member 3 and the second functional member 4 to improve the heat dissipation efficiency.

For example, when the first functional component 3 includes the motherboard 31 and the CPU 32, and the second functional member 4 includes the graphic card 41 and the GPU 42, the first type of heat pipe set may be a motherboard heat pipe set 221. The motherboard heat pipe set 221 may be individually configured to transfer heat of the CPU 32 of the motherboard 31. The motherboard heat pipe set 221 may be mainly arranged in the heat sink set 21 close to the motherboard 31. The second type of heat pipe set may be a graphic card heat pipe set 223. The graphic card heat pipe set 223 may be individually configured to transfer heat of the GPU 42 of the graphic card 41. The graphic card heat pipe set 223 may be mainly arranged in the heat sink set 21 close to the graphic card 41. The third type of heat pipe set may be a shared heat pipe set 222. The shared heat pipe set 222 may be configured to transfer the heat of both the CPU 32 and GPU 42. The shared heat pipe set 222 may be arranged across two areas of the heat sink set 21 corresponding to the motherboard 31 and the graphic card 32.

In a CPU burn-in mode, the power of the CPU 32 may be large, and the power of the graphic card 41 may be small. The motherboard heat pipe set 221 may transfer the heat of the CPU 32 to the heat sink fins corresponding to the motherboard 31. Meanwhile, the shared heat pipe set 222 may transfer the heat of the CPU 32 to the heat sink fins corresponding to the graphic card 41. Thus, the idle heat sink fins corresponding to the graphic card 41 may be used to increase the utilization rate of the heat dissipation area of the heat sink set 21. In a graphic card burn-in mode, the power of the graphic card 41 may be large, and the power of the CPU 32 may be small. The graphics card heat pipe set 223 may transfer the heat of the graphic card 41 to the heat sink fins corresponding to the graphic card 41. Meanwhile, the shared heat pipe set 222 may transfer the heat of the graphic card 41 to the heat sink fins corresponding to the CPU 32. Thus, the idle heat sink fins corresponding to the CPU 32 may be used to increase the utilization rate of the heat dissipation area of the heat sink set 21 to achieve a best heat dissipation effect.

Further, in embodiments of the present disclosure, the heat pipe set 22 in thermal contact with the first functional member 3 may be partially exposed to the outside of the first heat transfer contact surface of the heat sink set 21. The first heat transfer contact surface may correspond to the first functional component 3. The heat pipe set 22 in thermal contact with the second functional member 4 may be partially exposed to the outside of the second heat transfer contact surface of the heat sink set 21. The second heat transfer contact surface may correspond to the second functional member 4. The heat pipe set 22 in thermal contact with both of the first functional member 3 and the second functional member 4 may be partially exposed to the outside of the first heat transfer contact surface and the second heat transfer contact surface. That is, the first type of heat pipe set may be partially exposed to the first heat transfer contact surface of the heat sink set 21. The second type of heat pipe set may be partially exposed to the second heat transfer contact surface of the heat sink set 21. A portion of the third type of heat pipe set may be exposed to the first heat transfer contact surface, and another portion of the third type of heat pipe set may be exposed to the second heat transfer contact surface. In some embodiments, a portion of the main board heat pipe set 221 may be exposed to the outside of the first heat transfer contact surface and be in contact with the CPU 32 of the motherboard 31 to transfer heat. A portion of the graphic card heat pipe set 223 may be exposed to the outside of the second heat transfer contact surface and be in contact with the GPU 42 of the graphic card 41 to transfer heat. A portion of the shared heat pipe set 222 may be exposed to the outside of the first heat transfer contact surface and be in contact with the CPU 32 of the motherboard 31 to transfer heat. A portion of the shared heat pipe set 222 may be exposed to the outside of the second heat transfer contact surface and be in contact with the GPU 42 of the graphics card 41 to transfer heat.

As shown in FIG. 1, further, in some embodiments, an air inlet structure 11 and an air outlet structure 12 are arranged at both ends of the cylindrical housing 1, respectively. The air inlet structure 11 includes a fan 6. The fan 6 may be configured to discharge the heat of the heat dissipation assembly 2 from the air outlet structure 12. Arranging the air inlet structure 11 and the air outlet structure 12 at the two ends of the cylindrical housing 1, respectively, may facilitate airflow in the cylindrical housing 1 to take away heat. The electronic apparatus may dissipate the heat of the first functional member 3 and the second functional member 4 by one fan 6, which reduces a number of fans 6, makes the structure more compact, and reduces the volume. The fan 6 may include an axial fan, which provides airflow along the axial direction of the cylindrical housing 1. The air inlet structure 11 and the air outlet structure 12 may also be arranged in other positions of the cylindrical housing 1, for example, on sidewalls.

In embodiments of the present disclosure, the electronic apparatus further includes a power module 5 and a storage module arranged in the cylindrical housing 1 and connected to the first functional member 3. The power module 5 may be configured to supply power. The storage module may be configured to store data, for example, a hard disk. Both of the power supply module 5 and the storage module are located in the second area 14 so as to make full use of the internal space of the cylindrical housing 1.

Further, the power module 5 is located at a position of the second area 14 close to the air outlet structure 12. The storage module is located at a position of the second area 14 close to the air inlet structure 11. The power module 5 and the storage module are arranged alternately along the axis of the cylindrical case 1, which further arranges the structure compactly and reduces the volume.

Embodiments of the present disclosure are described in a progressive manner, and each embodiment focuses on the differences from other embodiments. The same or similar parts between embodiments of the present disclosure may be referred to each other.

The description of the disclosed embodiments enables those skilled in the art to implement or use the present disclosure. Various modifications to these embodiments will be obvious to those skilled in the art. The general principles defined in the specification may be implemented in other embodiments without departing from the spirit or scope of the present disclosure. Therefore, the present disclosure will not be limited to the embodiments shown in this specification but should conform to the widest scope consistent with the principles and novel features disclosed in this specification.

What is claimed is:

1. An electronic apparatus comprising:
    a cylindrical housing including an air inlet structure and an air outlet structure;
    a first functional member and a second functional member arranged in the cylindrical housing, the first functional member and the second functional member being alternately arranged; and
    a heat dissipation assembly arranged in the cylindrical housing, and including:
        a heat sink set including a plurality of heat sink fins to enlarge a heat dissipation area; and
        a plurality of heat pipe sets arranged through the heat sink set, each of the first functional member and the second functional member being correspondingly in contact with at least one heat pipe set to transfer heat, heat of each of the first functional member and the second functional member being transferred to the heat dissipation set through the corresponding heat pipe set;
    wherein the first functional member and the second functional member are thermally connected to two heat transfer contact surfaces of the heat dissipation assembly, respectively, and the heat dissipation assembly is configured to perform heat dissipation processing on the first functional member and the second functional member.

2. The electronic apparatus according to claim 1, wherein:
    the cylindrical housing has a cylindrical structure, an elliptical cylindrical structure, or a polygonal cylindrical structure;
    the first functional member and the second functional member include different shape parameters; and
    the first functional member and the second functional member are parallel to an axial direction of the cylindrical housing.

3. The electronic apparatus according to claim 2, wherein:
    the first functional member divides the cylindrical housing into a first area and a second area from inside; and
    the heat dissipation assembly and the second functional member are located in the first area.

4. The electronic apparatus according to claim 3, wherein:
    the first functional member and the second functional member are arranged perpendicular to each other; and
    the two heat dissipation contact surfaces of the heat dissipation assembly are perpendicular to each other.

5. The electronic apparatus according to claim 1, wherein:
    at least one heat pipe set is in thermal contact with both the first functional member and the second functional member so that the heat pipe set is capable of performing heat dissipation processing on the first functional member and the second functional member.

6. The electronic apparatus according to claim 5, wherein
    a heat pipe set in thermal contact with the first functional member is partially exposed outside of a first heat dissipation contact surface of the heat sink set, the first heat transfer contact surface corresponding to the first functional member;
    a heat pipe set in thermal contact with the second functional member is partially exposed outside of a second heat dissipation contact surface of the heat sink set, the second heat transfer contact surface corresponding to the second functional member; and
    a heat pipe set in thermal contact with both the first functional member and the second functional member is partially exposed outside of the first heat dissipation contact surface and the second heat dissipation contact surface.

7. The electronic apparatus according to claim 1, wherein:
    the air inlet structure and the air outlet structure are arranged at two ends of the cylindrical housing, respectively; and
    the air inlet structure includes a fan configured to discharge heat of the heat dissipation assembly from the air outlet structure.

8. The electronic apparatus according to claim 3, further comprising:
    a power module configured to supply power; and
    a storage module configured to store data;
    wherein:
        the power module and the storage module are arranged in the cylindrical housing and connected to the first functional member; and
        the power module and the storage module are located in the second area.

9. The electronic apparatus according to claim 8, wherein:
    the power module is located at a position of the second area close to the air outlet structure; and
    the storage module is located at a position of the second area close to the air inlet structure.

\* \* \* \* \*